United States Patent [19]
Wright et al.

[11] 4,450,619
[45] May 29, 1984

[54] COMPONENT INSERTING MACHINE

[75] Inventors: Henry L. Wright, Ipswich; Vitaly Bandura, Danvers; Daniel W. Woodman, Jr., Beverly, all of Mass.

[73] Assignee: USM Corporation, Farmington, Conn.

[21] Appl. No.: 271,835

[22] Filed: Jun. 9, 1981

[51] Int. Cl.³ .............................................. B21F 1/02
[52] U.S. Cl. .................................. 29/564.1; 29/53 M; 29/741; 140/105
[58] Field of Search ................. 29/564.1, 33 K, 33 M, 29/564.2, 564.7, 564.8, 741; 140/105, 147

[56] References Cited

U.S. PATENT DOCUMENTS

| | | | |
|---|---|---|---|
| 3,550,238 | 12/1970 | Allen et al. .......................... 29/564.1 |
| 3,591,040 | 7/1971 | Lambert . | |
| 3,727,284 | 4/1973 | Ragard et al. . | |
| 3,777,350 | 12/1973 | Meada et al. . | |
| 4,051,593 | 10/1977 | Mori et al. .............................. 29/714 |
| 4,063,347 | 12/1977 | Woodman, Jr. ................... 29/564.1 |
| 4,149,641 | 4/1979 | DeVita et al. ......................... 29/809 |
| 4,367,584 | 1/1983 | Janisiewicz et al. .................. 29/741 |

Primary Examiner—E. R. Kazenske
Assistant Examiner—Hien H. Phan
Attorney, Agent, or Firm—Alan N. McCartney

[57] ABSTRACT

A high performance machine for selecting electronic components from magazines containing a variety of configured components, the components in each of the magazines have a different center line spacing from the center line spacing the components of each of the other magazines, each magazine having control unit indicating the particular configured components contained in the magazine for providing signals for controlling the setting of component conditioning and inserting devices for operating on each component according to its particular configuration.

16 Claims, 29 Drawing Figures

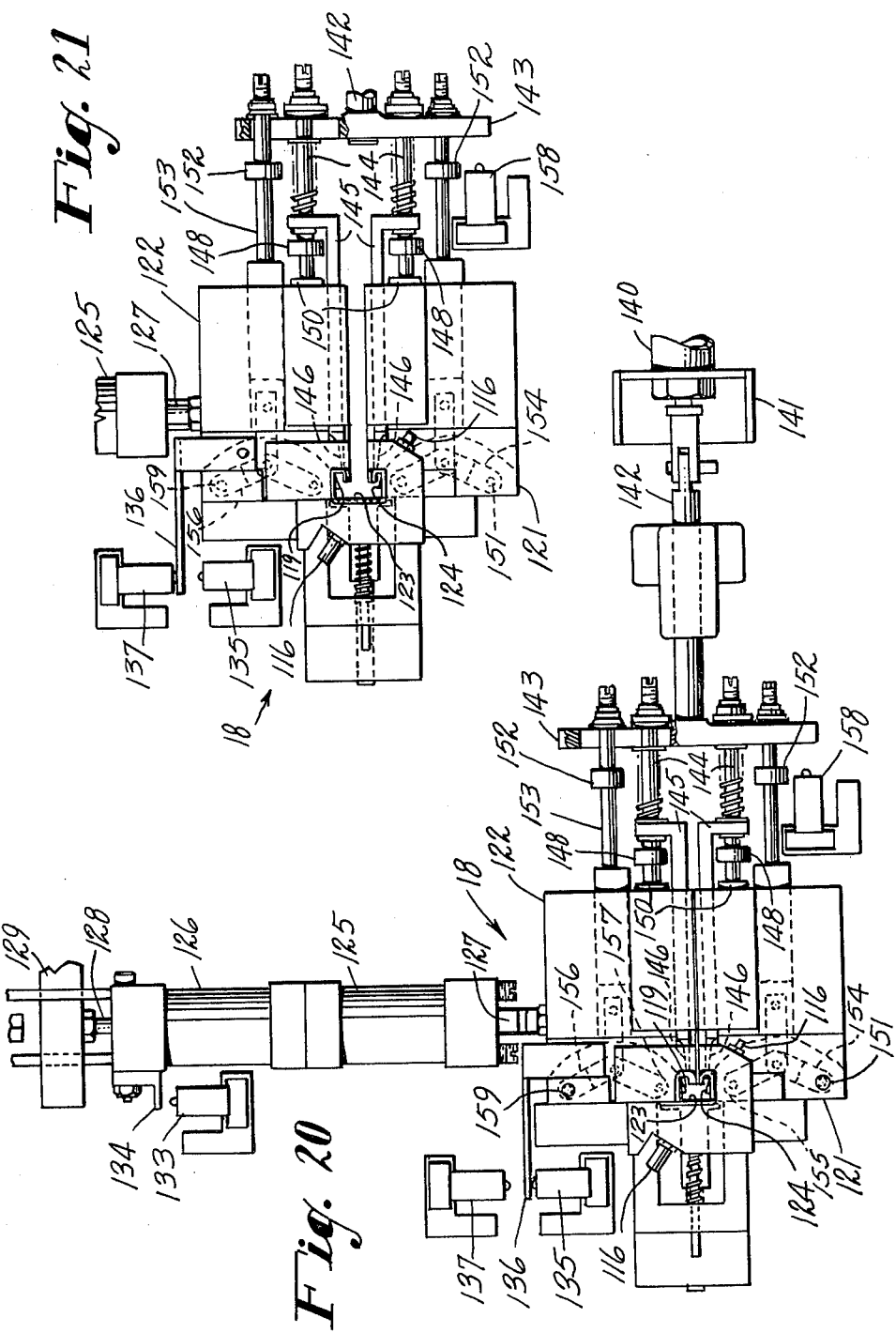

Fig. 25

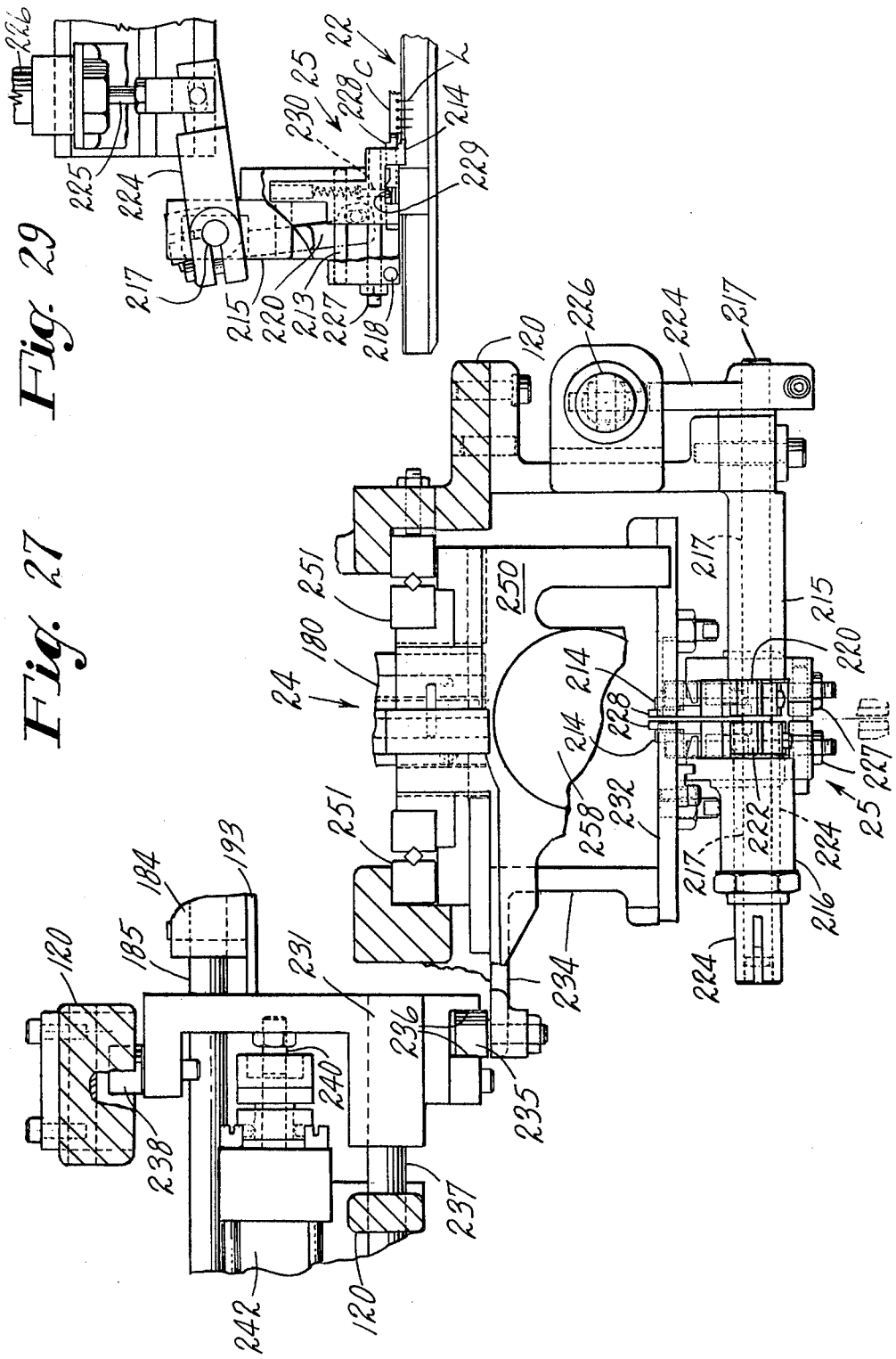

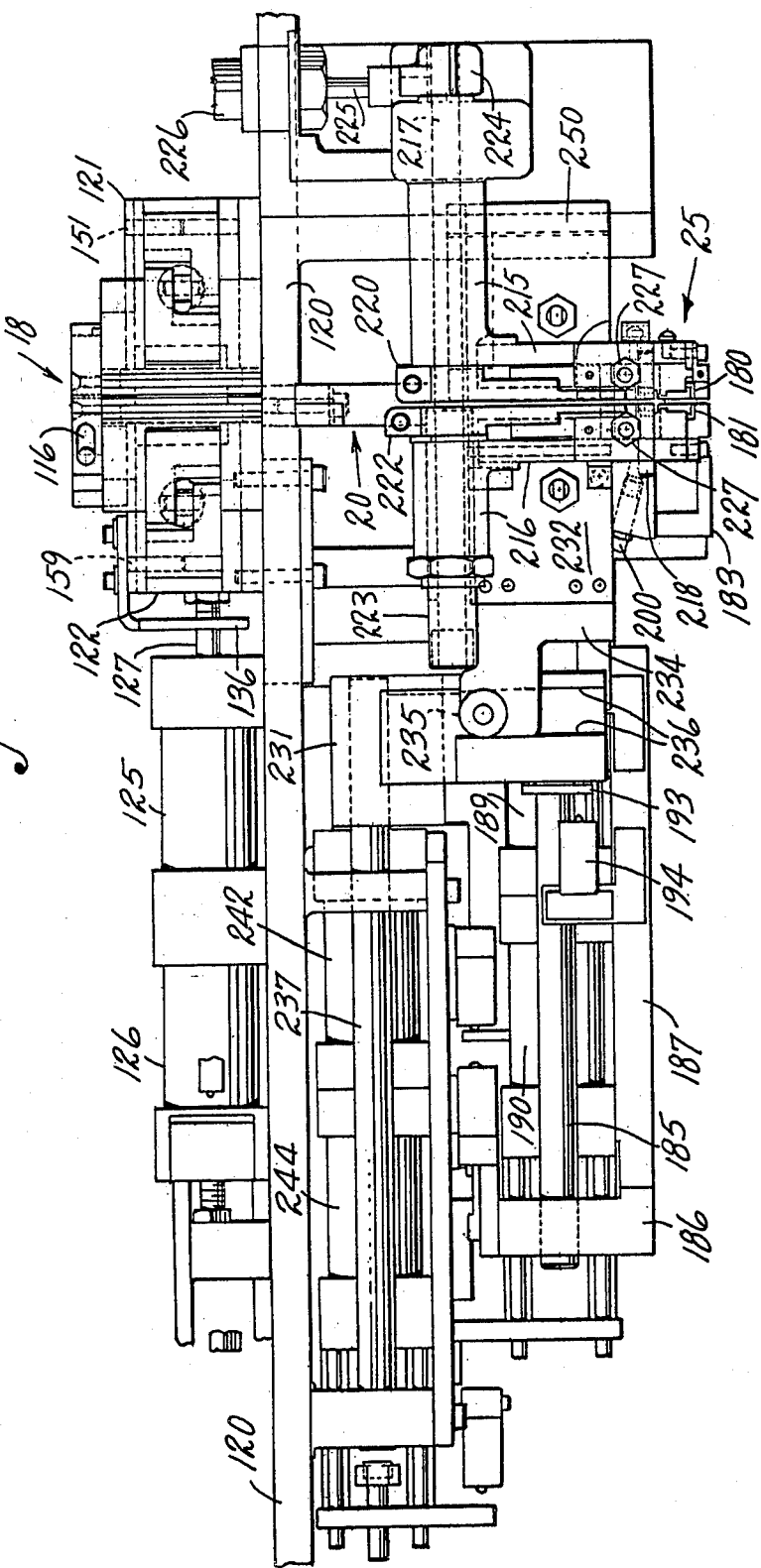

COMPONENT INSERTING MACHINE

FIELD OF INVENTION

This invention relates to a high performance machine for selecting a variety of electronic components such as of the type commonly known as "DIP" and component sockets from a plurality of magazines and for conditioning and inserting the selected components or sockets in circuit boards which are automatically positioned under the control of a programmable computer.

BACKGROUND OF THE INVENTION

Description of the Prior Art

Multi-lead DIP components have been processed and inserted in circuit boards by machines such as disclosed in U.S. Pat. Nos. 3,591,040 and 3,550,238. As there shown, components are selectively aligned with an inserting mechanism by shifting a magazine and releasing the components singly for mounting by inserting means after their leads are straightened if necessary. With a larger variety and supply of components, larger capacity magazines were held stationary and shiftable means selected and deposited single components as disclosed in U.S. Pat. No. 3,727,284. U.S. Pat. No. 4,063,347 shows a machine for selecting a variety of DIP components from a plurality of magazines by a computer controlled picker mechanism and delivering the selected components to a lead straightening unit and thence to a circuit board for insertion. As described in said U.S. Pat. No. 4,063,347 a single picker is moved along a row of magazines and selects particular components each having a particular size feature for transport one-at-a time to a lead conditioning unit. While the machine improved on the efficiency, reliability of control and performance of machines previously available, the output of the machine is limited to handling of components having the same size feature. None of the machines of the prior art have the facility to handle components having a variety of size features, such as lead center spacing either for selection or for automatic adjustment of component conditioning units according to the size feature of each selected component.

The machine illustrative of the present invention provides an improved means for selecting components from a variety thereof with a greater efficiency and output and taking full advantage of the ability of presently available programmable computer directed controls to keep track of a variety of near simultaneously occurring operations and to program both selection conditioning according to size and delivery of the components.

SUMMARY OF THE INVENTION

It is a general object of the invention to provide an improved component inserting machine having a plurality of magazines each dedicated to contain and supply components having the same size feature. Each magazine may be adapted for components having different size features with each magazine being provided with means peculiarly indicative of such feature to provide a signal to control means of such feature. Accordingly, each magazine is provided with at least two locating pins adapted to actuate associated switches to condition the control means. The machine is provided with means such as a component lead conditioning unit which is sensitive to the control means for adjustment to operate on each component according to the size feature of the component being delivered thereto.

According to one feature of the invention, the machine is adapted to select and handle simultaneously a plurality of components which are delivered in sequence to a series of conditioning and inserting units each of which must be adjusted as to the size feature of each component prior to delivery to each unit.

According to another feature, each component before application to a circuit board is fed along a mandrel and located by engagement of its leads with a stop. Yieldable plungers engage the body of the component before the leads engage the stop to absorb most of the kinetic energy of the moving component preventing distortion of the leads and mislocation of the component.

These and other features of the invention together with novel details of construction will be described with particular reference to preferred embodiment.

DESCRIPTION OF THE DRAWINGS

FIG. 20 is a plan view of the component conditioning unit adapted to form the component leads and omitting details of the frame;

FIG. 21 is a view similar to FIG. 20 with the parts of the former in condition to operate on a component having a large center spacing;

FIG. 25 is a plan view of the mandrel mounting and adjusting means taken generally on line XXV—XXV of FIG. 23;

FIG. 27 is a plan view partly in section of the component locating means taken generally on line XXVII of FIG. 2;

FIG. 28 is a front view of the mechanism shown in FIG. 27 with certain parts omitted; and FIG. 29 is a side view of the component stop locating means shown in FIG. 27.

Referring to FIGS. 1 to 4, the machine is provided with a plurality of magazines 10 generally similar to those shown in U.S. Pat. No. 4,063,347 arranged in a row forming a path along opposite sides of which a front picker 12 and a rear picker 14 move back and forth in a non-interfering relation. As controlled by means such as a computer or tape reader 8, the pickers select individual components from raceways 16 in each magazine and transport and deposit the selected component in a shuttle 72 for transfer to a conditioning unit 18 which forms or straightens leads extending from opposite sides of each component. The lead conditioning unit is generally similar to that described in said Patent No. 4,063,347. After the component leads are conditioned the component is released and directed by a chute 20 (FIGS. 2 and 3) to a transfer mandrel 22 and at the appropriate time is moved by a thruster 24 to a stop 25 for accurate location. The component is then gripped by a pair of notched fingers 28 which space adjacent component leads and bend the leads inwardly to match the spacing of holes in a circuit board B on which the component is to be mounted. The fingers move the component bodily downward toward the board and a pusher 30 seats and holds the component on the board while the fingers open to release the component. A cut-clinch unit 32 underlying the board is arranged to cut the ends of the leads and clinch them against the underside of the board.

Figure 1:
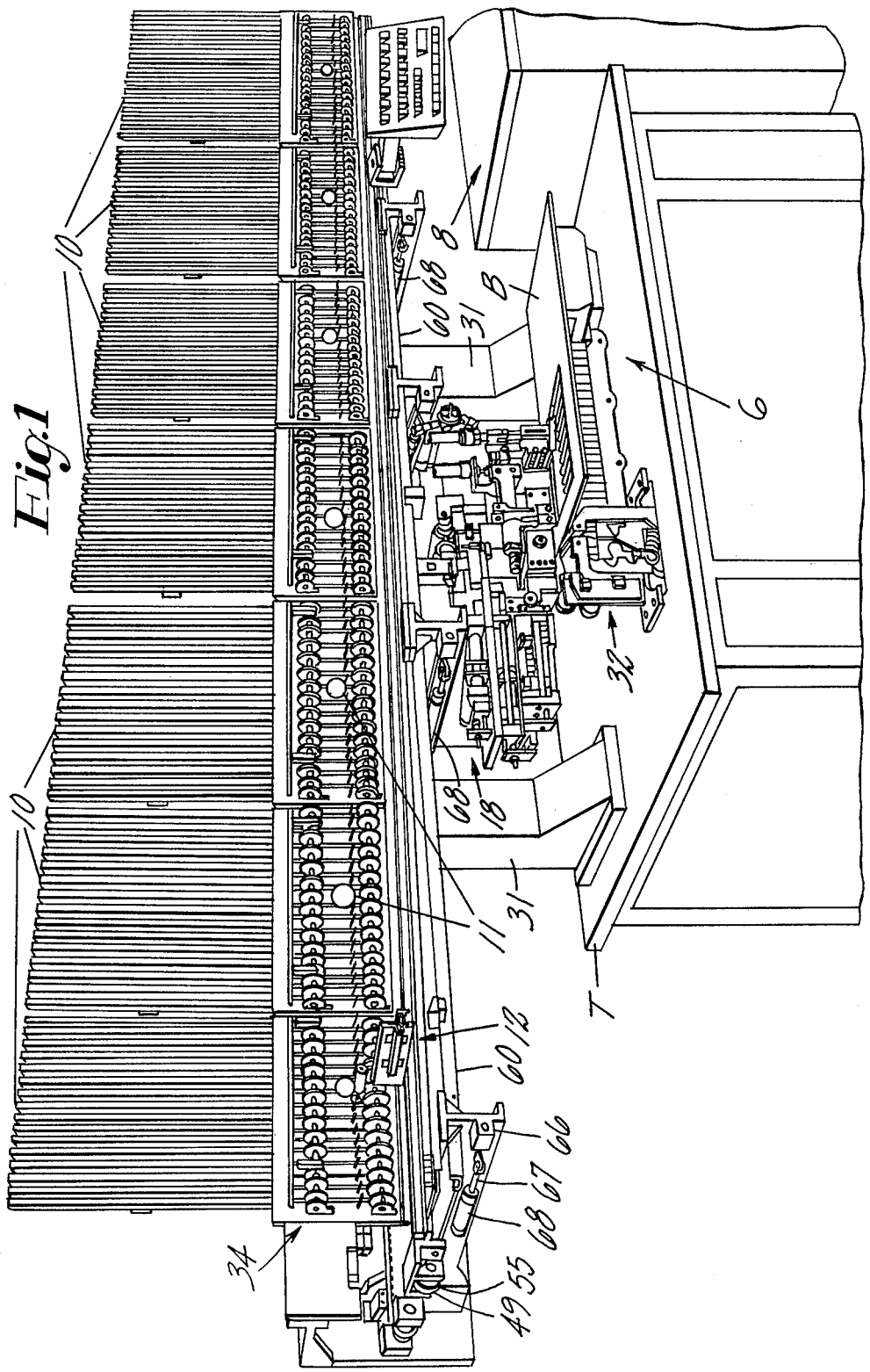
FIG. 1 is a perspective view of a machine embodying the present invention.

Each magazine 10 is secured by a bolt having a hand knob 11 (FIGS. 1 and 2) to a bracket 34 mounted on the machine frame which inludes a pair of posts 31 upstanding from a table T. Each magazine has two pins 32, one shown in FIGS. 3 and 4, received in locating holes 33 in the bracket, each pin having an extension coacting with an associated switch 35. Each magazine has a plurality of raceways 16 each containing components having a particular center spacing (C.S.) of outwardly and downwardly extending component leads which for example may be 0.300" C.S., 0.400" C.S., or 0.600" C.S. In the preferred embodiment, the machine is shown as provided with seven magazines 10, each dedicated to components all having the same lead center spacing. Obviously, more or less magazines and other center spacing sizes may be provided. The two locating pins 32 of each magazine are adapted to actuate the associated switches 35 in a manner peculiar to and indicative of the center spacing of the leads of the components in the raceway channels of the magazine. Thus, each magazine has its own peculiar pattern of short and long locating pins, depending on the center spacing (C.S.) of the leads of the components for which the magazine is dedicated adapted to actuate the switches in a manner indicating the C.S. of the components.

| For Example: | Magazine Component C.S. | Left Switch | Right Switch |
|---|---|---|---|
| | .300"C.S. | On | On |
| | .400"C.S. | On | Off |
| | .600"C.S. | Off | On |
| | No Magazine | Off | Off |

The positions of switches 35 as described will indicate to the computer control the particular component present in a given magazine. This signal is then relayed to the control of the component conditioner to position the conditioner for a given component to be received from the picker after selection from the magazine (as will become more apparent hereinafter). Channel to channel spacing also varies for each magazine depending on the center spacing of the component leads for which the magazine is dedicated so that identification of magazine type in each of the seven positions is necessary to allow accurate travel and registration of the pickers with the desired channel. It should be obvious that the arrangement of locating pins and associated switches are only illustrative of a preferred embodiment and could be indicative of component attributes other than lead center spacing and could involve other types of indicating and sensing means. Certain concepts involved also are the subject of copending application for U.S. patent Ser. No. 271,836 filed June 9, 1981 now U.S. Pat. No. 4,387,506 granted June 14, 1983 in the name of the present inventors and such application is herein incorporated by reference for further description if desired.

Figure 2:
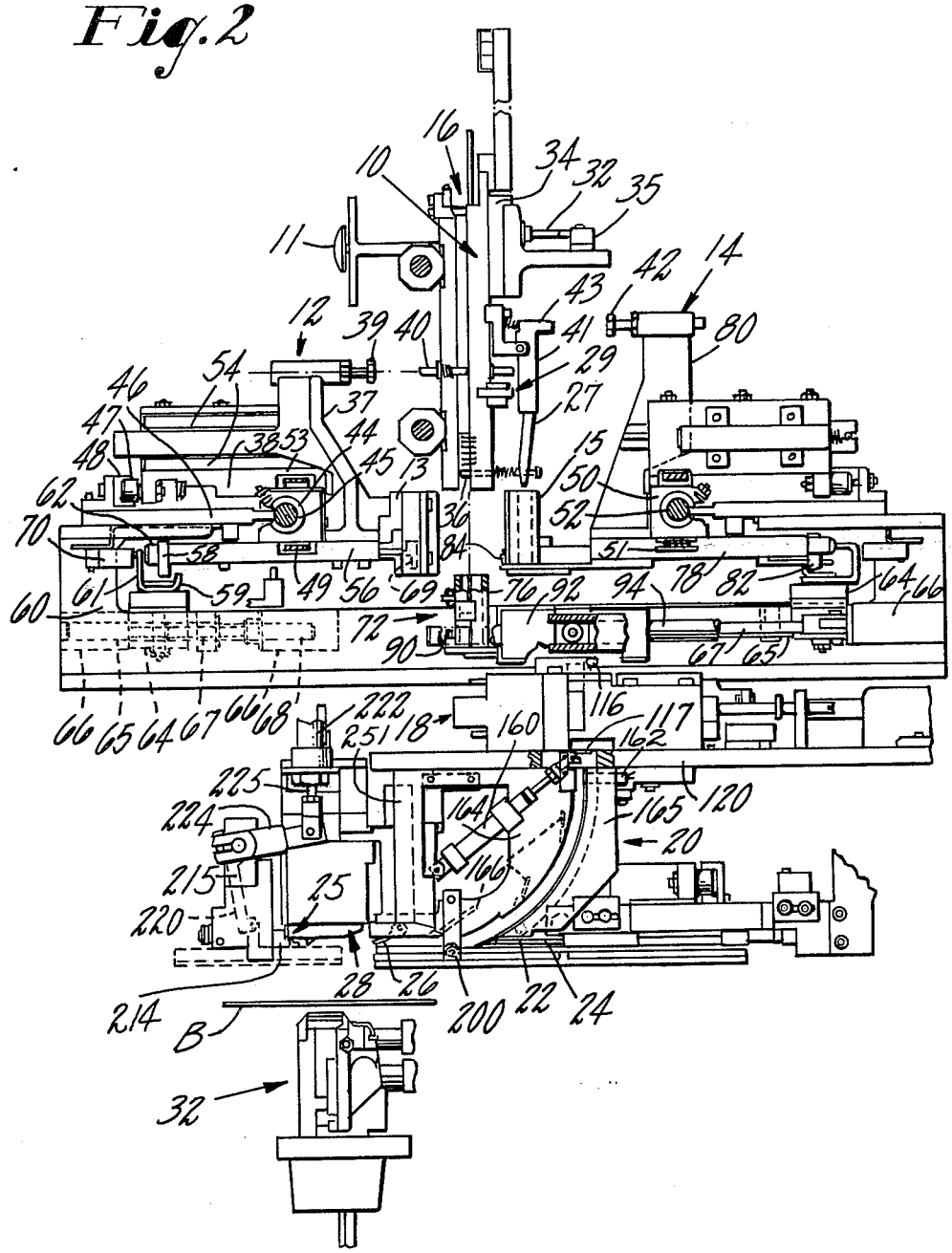
FIG. 2 is a side elevation of the machine with parts of the machine frame removed for clarity.
Figure 3:
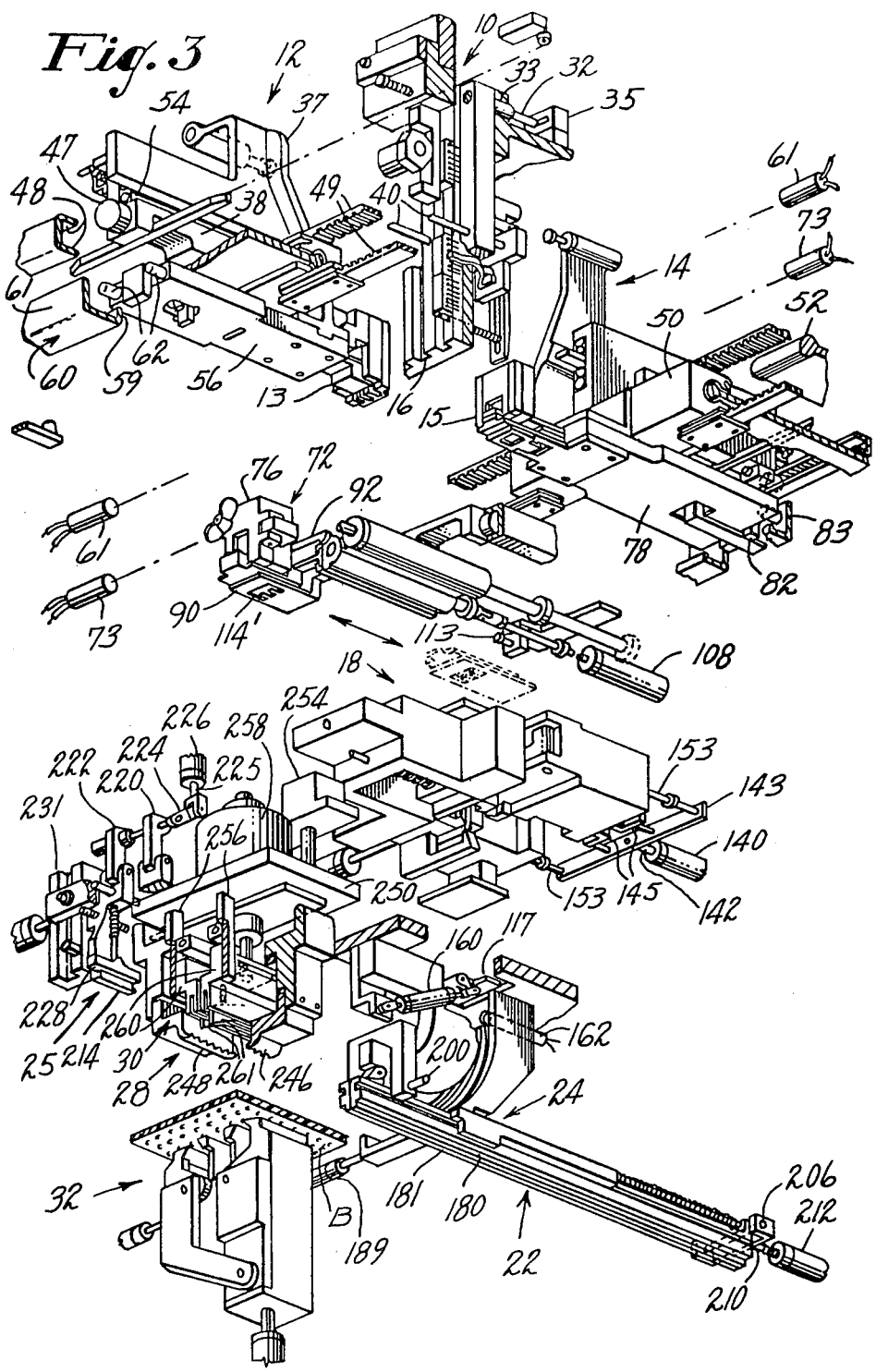
FIG. 3 is a schematic view in perspective of the mechanisms shown in FIG. 2.
Figure 4:
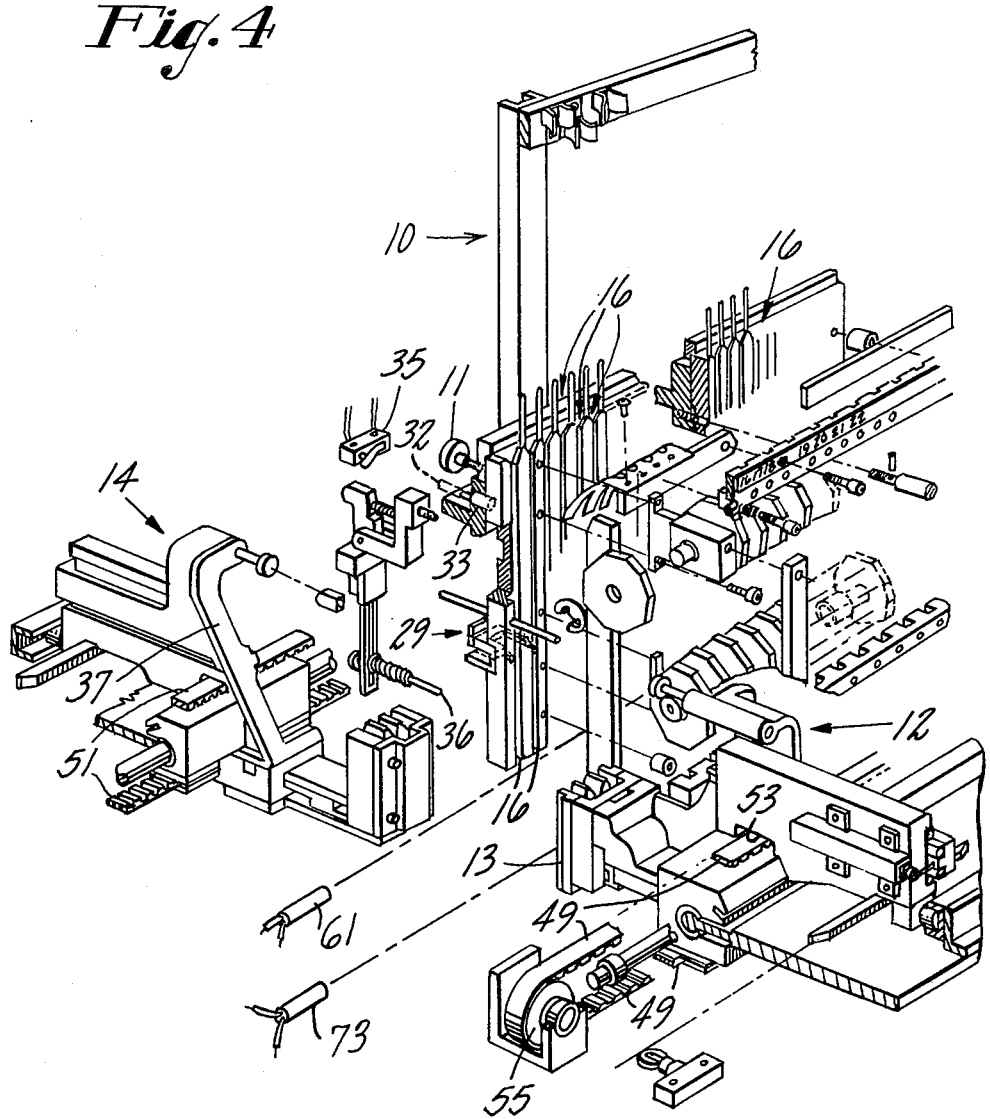
FIG. 4 is a schematic view in perspective on an enlarged scale of the component picker selecting means.
Figure 5:
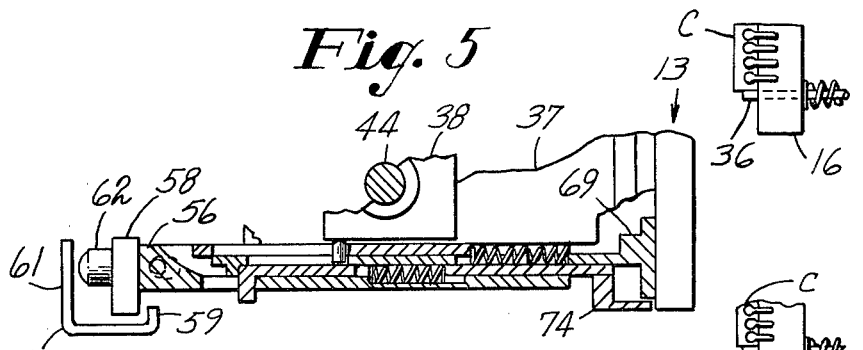
FIGS. 5 through 9 are progressive views of fragments of the front picker mechanism and related parts.
Figure 6:
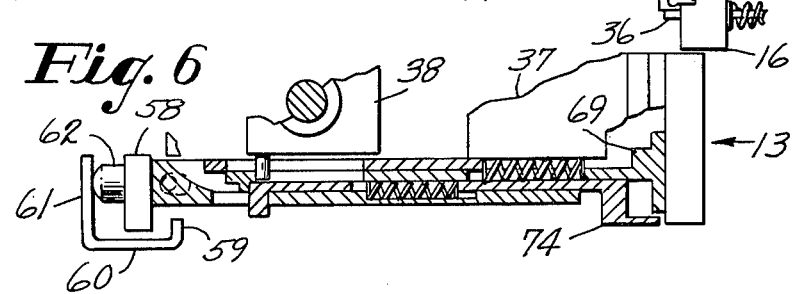
Figure 7:
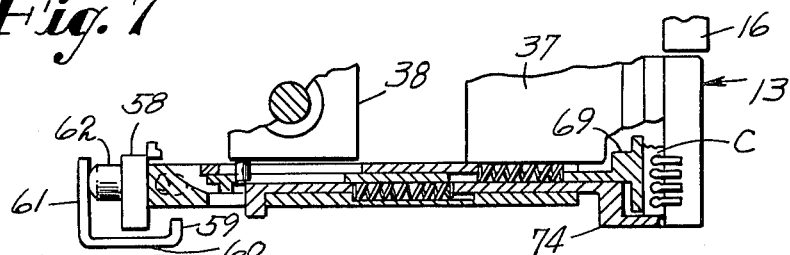
Figure 8:
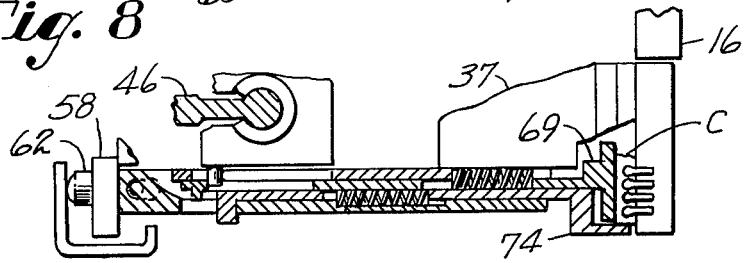

Referring to FIG. 4, the magazines each have a number of raceway channels 16 each adapted to contain a vertical column of similar components. Each channel is settable to suit variations in component thickness by adjustment of two eccentric wheels which position a vertical bar in and out. This adjustment is generally similar to that shown in U.S. Pat. No. 4,063,347 which is incorporated herein by reference if a more detailed description is desired. Each channel is provided with an escapement operable from either side of the magazines by either the front or rear picker 12 and 14 respectively to control component release. The escapement mechanism for each channel includes a plunger 36 (FIG. 2) which acts as a stop for the lowest component in the channel and a pair of grippers 29 which holds the second component from dropping when the plunger 36 is retracted to release the lowermost component. The escapement mechanism described to this point is generally similar to that described in U.S. Pat. No. 4,149,641 which is incorporated herein by reference for a more detailed discussion if desired. The escapement, however, is operated in a different manner from that described in said U.S. Pat. No. 4,149,641 alternately by either picker mechanism. The front picker 12 is provided with a receptacle 13 adapted to be reciprocated from a retracted position as seen in FIGS. 2, 3 and 5 to an inward position registered with a selected raceway channel as seen in FIG. 7. The receptacle is carried by a bracket 37 adapted to reciprocate on a carrier 38. The bracket has an actuator stud 39 which during inward movement engages and depresses a pin 40 and causes a lever 41 to be swung counterclockwise as best seen in FIG. 2. A forked tail piece 27 of the lever acts during such movement to retract the plunger 36 to release the lowermost component which drops by gravity into the underlying picker receptacle 13 (see also FIG. 7). A flat on lever 41 at this time also actuates the escapement grippers to hold the next component in the channel from dropping. The rear picker 14 has a stud 42 which also may swing the lever 41 counterclockwise by engagement with an arm 43 of lever 41 during inwardward movement of the rear picker to release a component into the rear picker receptacle 15 when so selected. When a component drops into either picker receptacle 13 or 15, a light source and cell 61 (FIG. 3) detects such passage and signals the control unit 8 to retract the receptacle and commence movement of the picker toward the shuttle 72.

PICKER MECHANISM

The pickers 12 and 14 are each moved independently between selected magazine channels and the shuttle 72 under the control of the unit 8. The front picker carrier 38 has a split sleeve bearing 44 slidable on a guide 45 carried by a plate 46 fixed on the machine frame. For further guidance, the carrier has a roll 47 running in a guideway 48 also mounted on the plate 46. The lower reach of a toothed belt 49 is secured to the underside of the carrier 38 as best seen in FIGS. 2 and 4, while the upper reach passes freely through an opening 53. The belt runs over a pulley 55 (FIG. 4) at one end and at the opposite end of the machine is driven by a reversible motor (not shown) under the control of the unit 8. To this point the picker drive is similar to that disclosed in said U.S. Pat. No. 4,063,347 to which reference may be had for a detailed description. The rear picker carrier 50 is mounted for movement along a guide 52 in similar fashion as for the front picker carrier and is driven by a toothed belt 51 in a manner similar to that for the belt 49.

Figure 9:
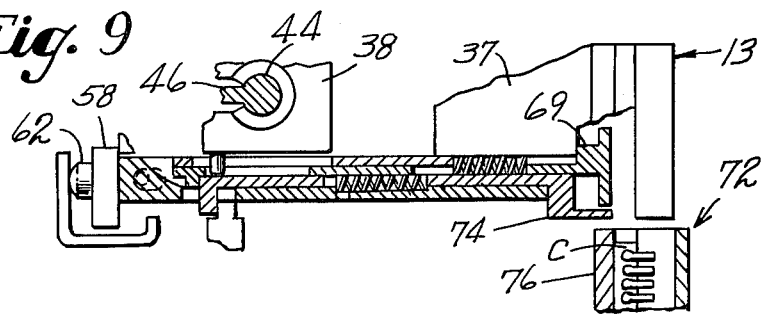
Figure 10:
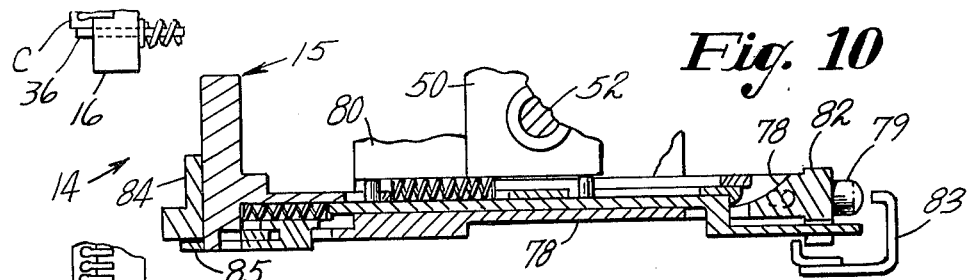
FIGS. 10 through 14 are progressive views of fragments of the rear picker mechanism and related parts.
Figure 11:
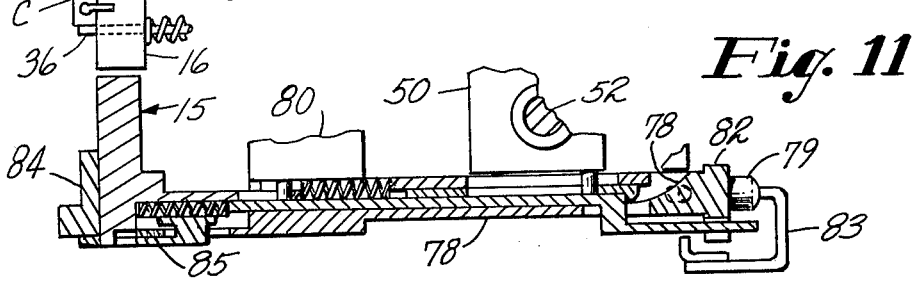

In the operation of the machine, the control unit 8 causes the pickers to be moved along guides 45 and 52 to a particular raceway channel of one of the seven magazines for selecting particular component to be applied to a circuit board according to a programmed sequence. During such movement of the picker receptacle for example, receptacle 13, of the front picker 12 is retracted as seen in FIGS. 3, 4 and 5. In retracted position the receptacles 13 and 15 of both pickers can pass without interference in their movements along the guides 45 and 52 as long as at least one of the receptacles is in retracted position. For moving the receptacle 13 from its retracted position to its advanced position registered with a selected magazine channel, the bracket 37 is mounted for reciprocation in guideways 54 (FIG. 2) on the carrier 38. A plate 56 secured to the bracket 37 and underlying the carrier 38 has at one end a lug 58 which lies within an inner wall 59 of a channel member 60 also having another upstanding wall 61 adapted to engage two yieldable rods 62. The machine is provided with two channel members 60 extending along the front of the machine each of which has at opposite ends a lug 64 (FIG. 2) from which extends a rod 65 mounted for reciprocation in bearings 66. Each lug is connected to a piston rod 67 extending from a cylinder 68 secured at one end to the machine frame (see also FIG. 1). By operating the cylinders 68 simultaneously at opposite ends of the channel member 60, the member is moved inward to move the plate 56, receptacle 13 and the picker bracket 37 toward the selected raceway magazine. Referring to FIGS. 5 to 8 there is shown the sequence of operation of the front picker 12 in which the receptacle 13 is moved into registration with the selected magazine channel and a clamp 69 is retracted, as seen in FIG. 7. During such movement, the magazine escapement is operated by the stud 39 on bracket 37 as above described to retract the stop 36 allowing the lowermost component to drop by gravity from the magazine into the receptacle 13 onto a gate 74 while the next component is held by fingers in the manner fully described in said U.S. Pat. No. 4,149,641. Reversal of the cylinders 68 then causes the receptacle 13 to be retracted until the wall 61 of the channel actuates a limit switch 70 (FIG. 2) and the belt operating motor is actuated to move the front picker belt 49 and the front picker receptacle along the magazines and into alignment with a shuttle 72. The cylinders 68 are again operated under the control of unit 8 moving the picker receptacle inwardly again until it registers with shuttle 72. During such movement, the clamp 69 releases the component and a gate 74 is retracted as seen in FIG. 9 allowing the component to drop by gravity into the shuttle bucket 76. A light source and detector cell 73 (FIG. 3) detects passage of a component from the picker into the shuttle.

Figure 12:
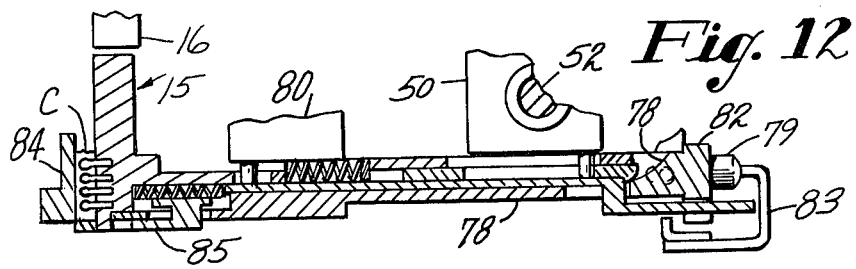
Figure 13:
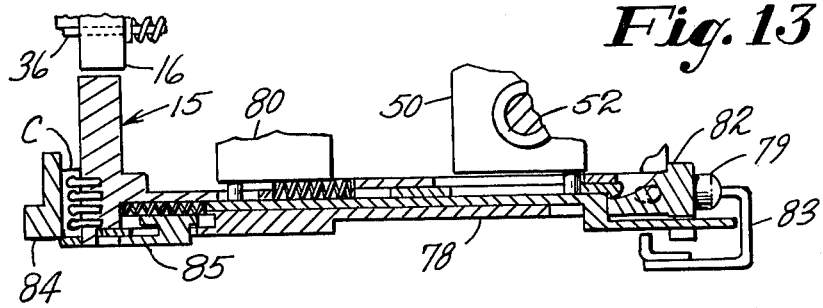
Figure 14:
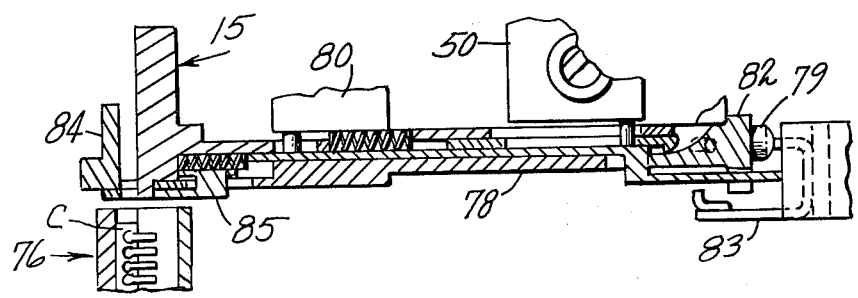

The rear picker 14 is operated in somewhat the same manner except that it travels at the opposite side of the magazine and acts directly against the lever 43. To this end, the receptacle 15 is mounted on the inner end of a plate 78 (FIGS. 2 and 10 to 14) secured to the picker bracket 80 which is mounted in guideways (not shown) on the carrier 50 similar to the guideways 54 for the front picker bracket 37. The plate 78 has a lug 82 and yieldable rods 79 received between the walls of the associated channels 83 which are similar to and mounted and operated in the same general manner as the channel members 60 for the front picker. In the operation of the machine, the rear picker receptacle 15 is moved into registration with a selected magazine channel. During such movement, the stud 42 (FIG. 2) on the rear picker bracket 80 swings the lever 41 to retract the stop pin 36 releasing the lowermost component which drops into the rear picker receptacle 15 as seen in FIG. 12. Also during such movement a component clamp 84 is moved out of the drop path of the component as best seen by a comparison of the positions of the various parts shown in the progressive views of the rear picker mechanism shown in FIGS. 10 to 13. At this time a gate 85 underlying receptacle 15 supports the component. After retraction, the rear picker is moved from the magazine parallel to the magazine into alignment and registered with the shuttle 72 and gate 85 is retracted as seen in FIG. 14 under the control of the unit 8 in the same manner as for the front picker unit. The cell 73 also detects the passage of a component from the rear picker into the shuttle and signals the control unit 8 to cause the next operation.

SHUTTLE MECHANISM

Figure 15:
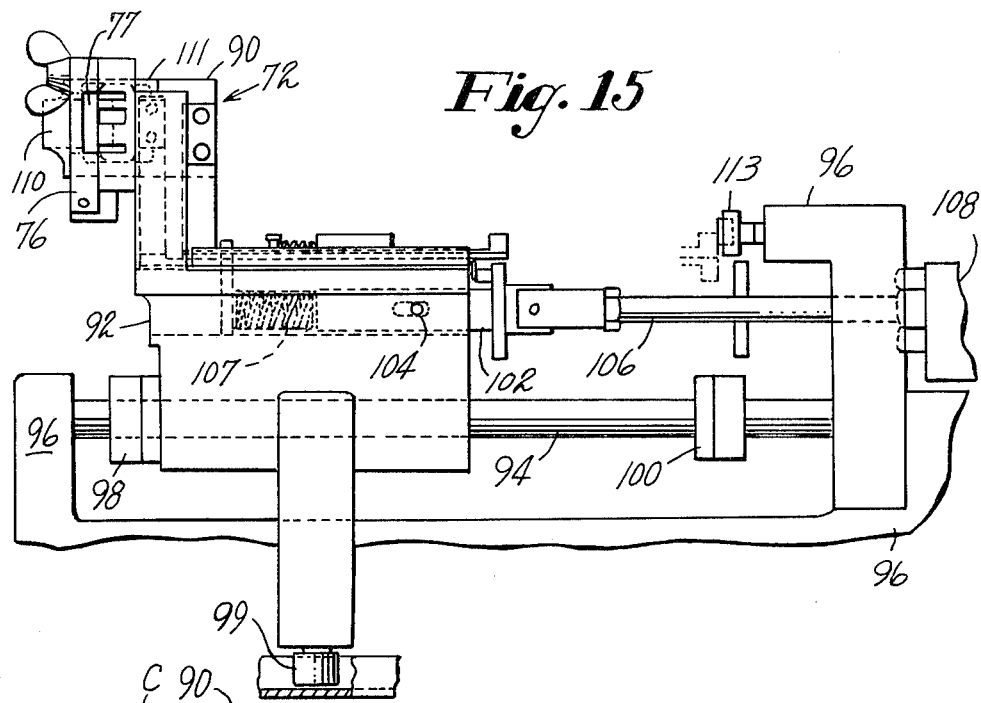
FIG. 15 is a plan view of the shuttle mechanisms.
Figure 16:
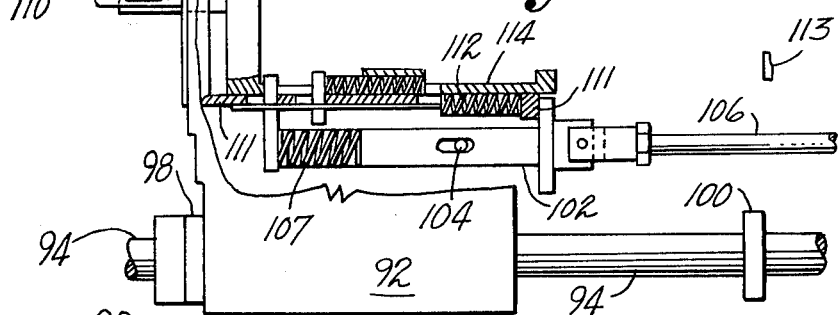
FIGS. 16 through 19 are fragmentary progressive views of the shuttle mechanism seen in FIG. 15.
Figure 17:
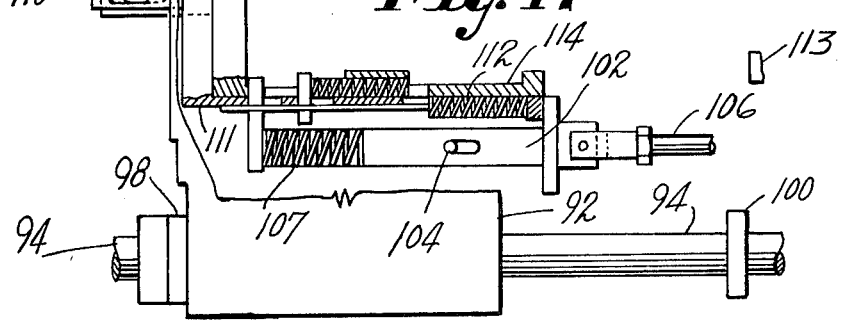
Figure 18:
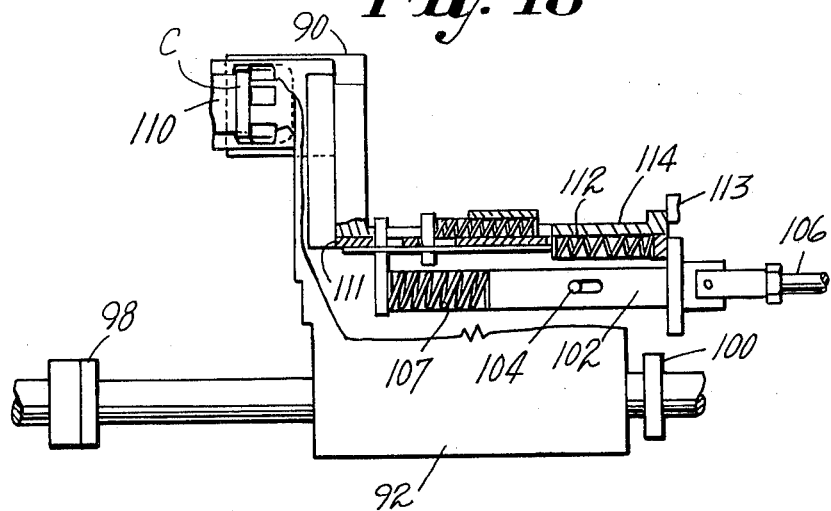
Figure 19:
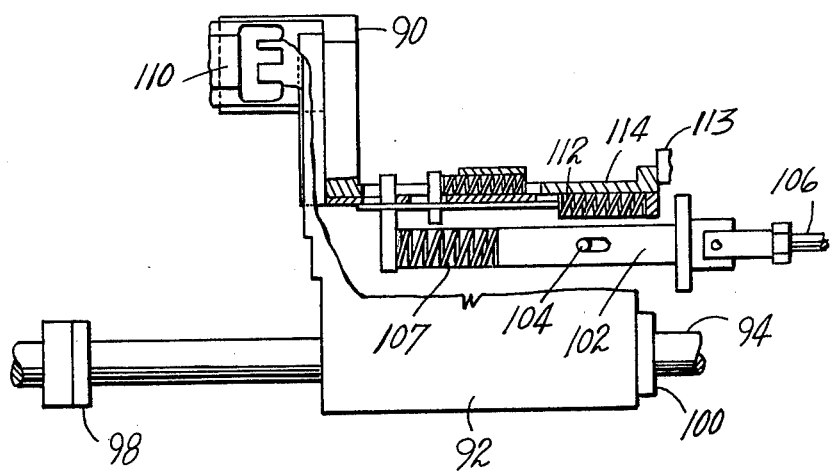

The shuttle 72 (FIGS. 2, 3 and 15) has a container 76 adapted to receive any size of component selected from a magazine channel and deposited from one of the picker receptacles 13 and 15 as above described. In its receiving position the shuttle occupies a central position shown in FIG. 2 for receiving components from either of the pickers. A gate 90 underlying the container 76 prevents the component from dropping through the receptacle when first received from a picker. The light source and photocell 73 detects entry of a component into the shuttle and through the unit 8 causes the shuttle to be moved from the receiving position to a depositing position registered with an opening in the lead conditioning unit 18. To this end, the shuttle has a carrier 92 (FIG. 15) mounted for reciprocation on a rod 94 fixed in a bracket 96 which is secured to the machine frame. A stop 98 on the rod determines the inner component receiving position of the shuttle and a stop 100 also on the rod locates the shuttle for registration with the lead conditioning unit 18. A roll 99 on the carrier runs in a guideway for further support. A rod 102 is mounted for axial movement in a hole in the carrier 92 as limited by a pin and slot connection 104 and abuts a compressed spring 107 in the carrier. The other end of rod 102 is connected to a piston rod 106 extending from a cylinder 108 secured to the bracket 96. A clamp 110 extending from a slide 111 guided in the carrier 92 is in the open condition as seen in FIGS. 15 and 16 permitting entry of a component into the shuttle container from a picker. Upon a signal from the cell 73 that a component has entered the shuttle the cylinder 108 is actuated moving the shuttle to the right. Referring to FIGS. 16 to 17, it may be seen that the intitial movement of the rod 102 allows the clamp slide 111 to move to the right to the position seen in FIG. 17 while the spring 107 holds the shuttle in its initial position (compare FIGS. 16 and 17). This movement of the slide 111 causes the clamp 110 to be pressed against the body of the component C in the shuttle container by a spring 112 to the limit of the pin and slot connection 104 (see FIG. 17). As seen in FIGS. 18 and 19, further movement of the shuttle causes a stop 113 carried by the bracket 96 to hold a slide 114 on which the gate 90 is mounted while the shuttle continues its movement to the right into engagement with the stop 100 (compare FIGS. 18 and 19). This causes an opening 114' (FIG. 3) in the gate 90 to register with the opening in the bottom of the shuttle container. At the same time during the continued movement of the shuttle carrier 92 and its container, the clamp 110 and gate 90 also are held against movement releasing the component which then drops from the shuttle into the opening of the conditioning unit 18 and onto a gate 117 (FIGS. 2 and 3). A light source and photocell 116 detects passage of the component into the lead conditioning unit 18.

COMPONENT LEAD CONDITIONING UNIT

The conditioning unit 18 (FIGS. 2 and 20) is mounted on a horizontal plate 120 secured to the machine frame. The unit includes a fixed section 121 (FIGS. 20 and 21) and a movable section 122. The fixed section is secured to the plate 120 and forms an end wall 123 and a fixed side wall 124 of an opening adapted to receive any one of the components having at least three possible center spacings (C.S.) of the component leads. The movable section 122 has a surface arranged to slide along the end wall 123 and forms a movable side wall 119. A T-shaped slide (not shown) extends though a matching slot in the plate 120 to guide the movable section. As discussed above, each magazine 10 is dedicated to a particular center spacing size of the component leads, each magazine having locating pins 32 which actuate related switches 35 to indicate the center spacing and transmits this intelligence to the control unit 8. The control unit is adapted to cause adjustment of the lead conditioning unit to accommodate the center spacing of the component selected from a particular magazine channel, transported by a picker, deposited in the shuttle and transported and deposited in the conditioning opening.

Figure 22:
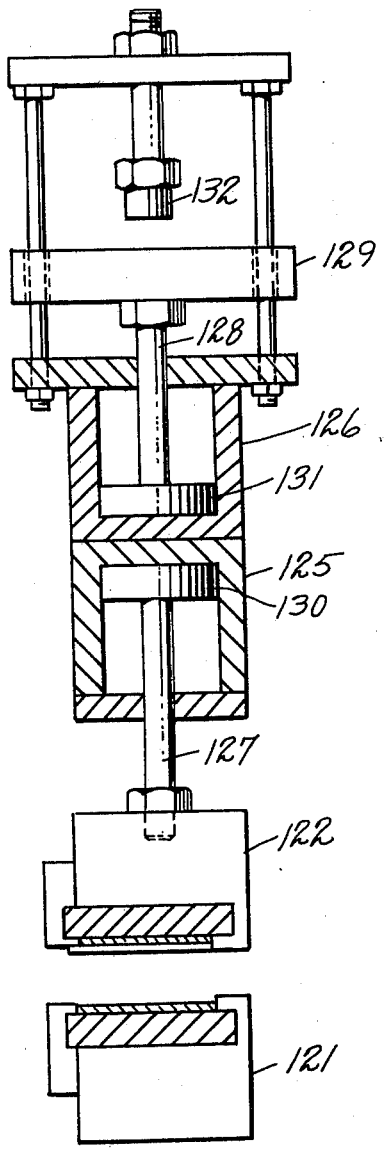
FIG. 22 is a schematic view of the cylinders which set the forming unit for size.

For adjusting the movable section 122 to suit the component size, the machine is provided with two cylinders 125, 126 secured together in end to end fashion. The cylinders 125, 126 are positioned in response to a signal from the computer control which has been programmed by switches 35 for a given component that is being supplied to the conditioning unit. A piston rod 127 extending from cylinder 125 is secured to the movable section 122 and a piston rod 128 extends from cylinder 126 and is secured to a bracket 129 fixed to plate 120. Referring to FIG. 22 the cylinders 125, 126 and their relation to the movable section 122 are diagrammatically shown with the piston 130 bottomed at the head end of cylinder 125 and the piston 131 bottomed at the rod end of cylinder 126 In this condition the movable section 122 is moved away from section 121 as far as possible and the opening is set to accommodate the largest center spacing (0.600") of a component. With this setting a limit switch 137 is actuated by an arm 136 secured to the movable section as seen in FIG. 21 and signals the setting to suitable means of the control unit 8. By introducing fluid such as air to the head side of piston 131 the cylinder 126 and its connected cylinder 125 are moved bodily with the movable section 122 until a stop 132 on a bracket extending from cylinder 126 engages the bracket 129. In this condition, the movable section 122 assumes an intermediate position and the opening is set to accommodate the 0.400" center spacing component size. At this time a limit switch 133 is actuated by an arm 134 on cylinder 126 (FIG. 20) to indicate such size setting. With pressure on the head side of piston 131 and to the head side piston 130 the movable section 122 is moved toward section 121 and the opening is set to its smallest size (0.300"). At this condition a limit switch 135 is actuated by the arm 136 on the movable section 122 to indicate such setting to the control unit 8.

As discussed in said U.S. Pat. No. 4,063,347 the component leads frequently are displaced from the desired center spacing causing jamming or misplacement of the component in the apertures of the circuit board. Thus, it is essential, that the component leads be straightened and/or conditioned to a desirable shape. To this end, the unit 18 is provided with a double acting cylinder 140 responsive to the signal from cell 116 that a component has entered the opening for the lead conditioning unit. The cylinder 140 is secured to a bracket 141 on the plate 120 with its piston rod 142 connected to a cross bar 143 secured by yieldable spring connections 144 to a pair of slides 145 which at their opposite ends carry inside lead forming anvils 146 which are tapered to enter between and condition the leads of the component in the unit opening formed by walls 123, 124 and 119 for reciprocation. One anvil slide is mounted in the fixed section 121 and the other is mounted on the movable section 122 and partakes of any size adjustment to suit the center spacing of the component in the unit opening. Introduction of pressure to the outward end of the cylinder 140 moves the anvils 146 between the leads of the components in the opening. The anvils are stopped in proper position when stops 148 on the connection with the cross bar engage bumpers 150 on the fixed and movable sections 121 and 122. Continued movement of the cross slide 143 compresses the yieldable connections 144 and the cross bar through stops 152 on rods 153 straightens a pair of toggles 154, 156. One end of toggle 154 is pivoted at 151 in the fixed section 121 while the other end is pivoted to a former 155 adapted to press one set of component leads against the anvil 146. One end of toggle 156 is pivoted at 159 on the movable section 122 while the other end is connected to a outside former 157 adapted to press the leads against anvil 146. When conditioning of the leads has been completed the cross bar 143 actuates a switch 158 and the cylinder 140 is reversed to retract the anvils 146 and formers 155, 157. At this time, a signal responsive to lead conditioning causes a cylinder 160 secured to the chute 20 to retract the gate 117 to drop the conditioned component into the chute 20. A light source and cell 162 (FIGS. 2 and 3) in the upper end of the chute detects passage of the component and signals start of the next operation. The chute 20 is curved as seen in FIG. 2 and includes members 164 and 165 forming the chute opening. Outlets 166 in member 164 for air jets urge the component along the chute and against the curved surface of member 165 until the component rests on a mandrel 22 against the yieldable stop 26 which is held in place by an air jet (not shown).

TRANSFER MANDREL

Figure 23:
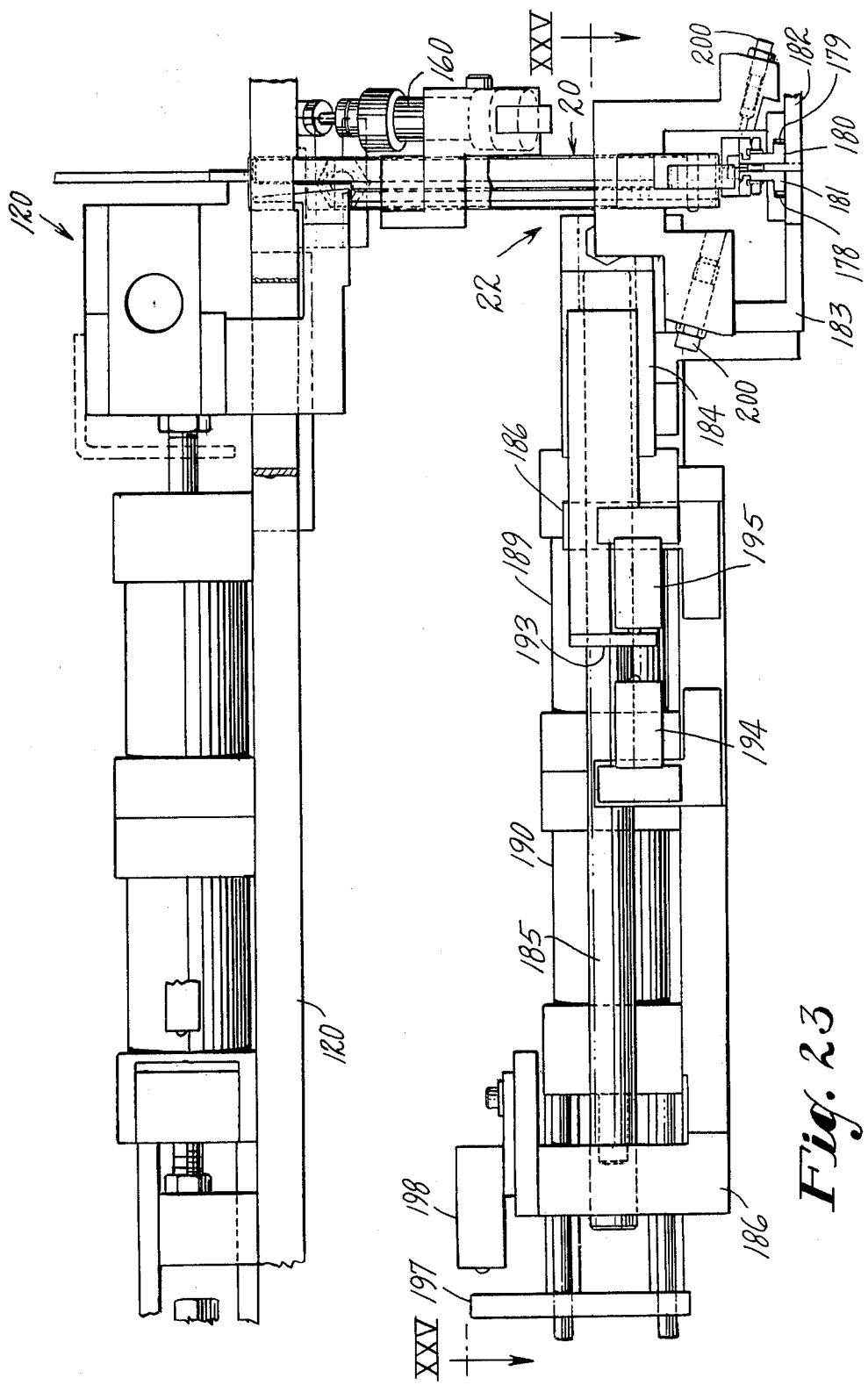
FIG. 23 is a front view of the forming unit and the mandrel unit with parts omitted for clarity.
Figure 25:
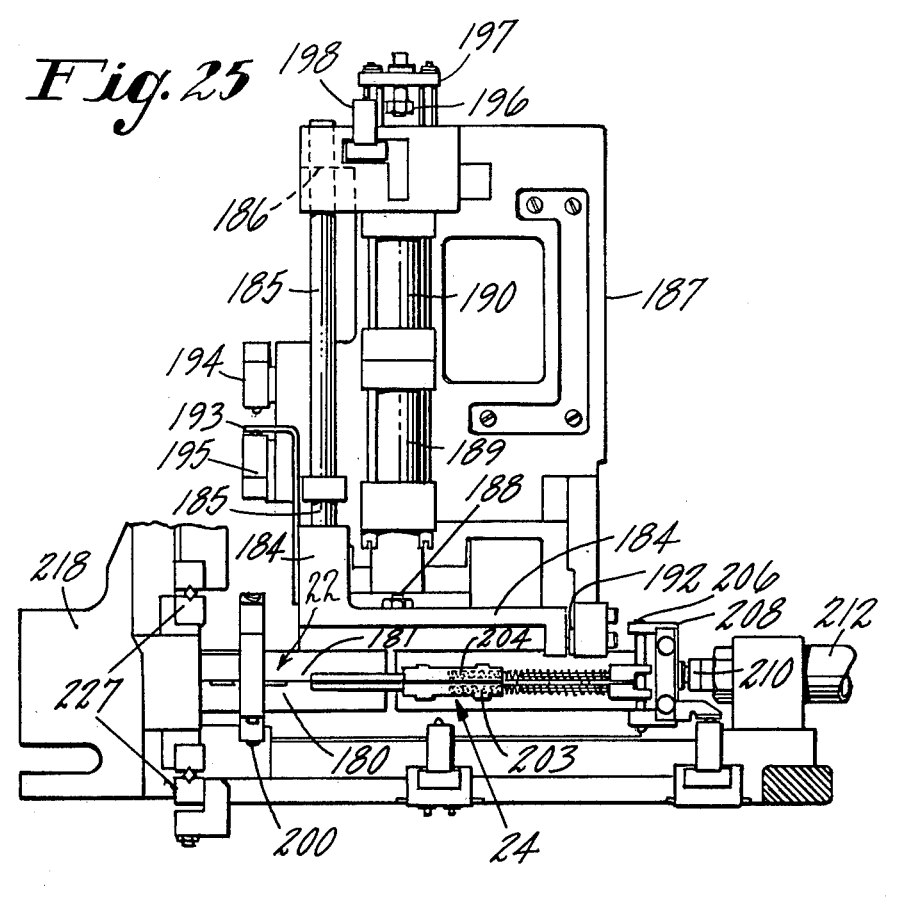

Before the component is dropped from the lead forming unit 18 by opening of the gate 117 the mandrel 22 is set to accommodate the center spacing of the component in the conditioning unit. To this end, the mandrel 22 has a fixed bar 180 and a movable bar 181 (FIG. 23). The fixed bar 180 is reciprocated in a guideway 179 formed on a plate 182 fixed to the plate 120. The movable bar 181 is reciprocated in a guideway 178 formed on a plate 183 secured to a movable bracket 184 (FIG. 25) mounted on a rod 185 which is reciprocable in bearings 186 of a bracket 187 also secured to the underside of plate 120. A piston rod 188 extending from a cylinder 189 is secured to the bracket 184. A cylinder 190 fixed end to end to the cylinder 189 has a piston rod 191 (FIG. 26) fixed to an extension of the bearing 186. The bracket 184 is further guided by a roll 192 on the bracket running in a guideway on the bracket 187 as seen in FIG. 25.

Figure 24:
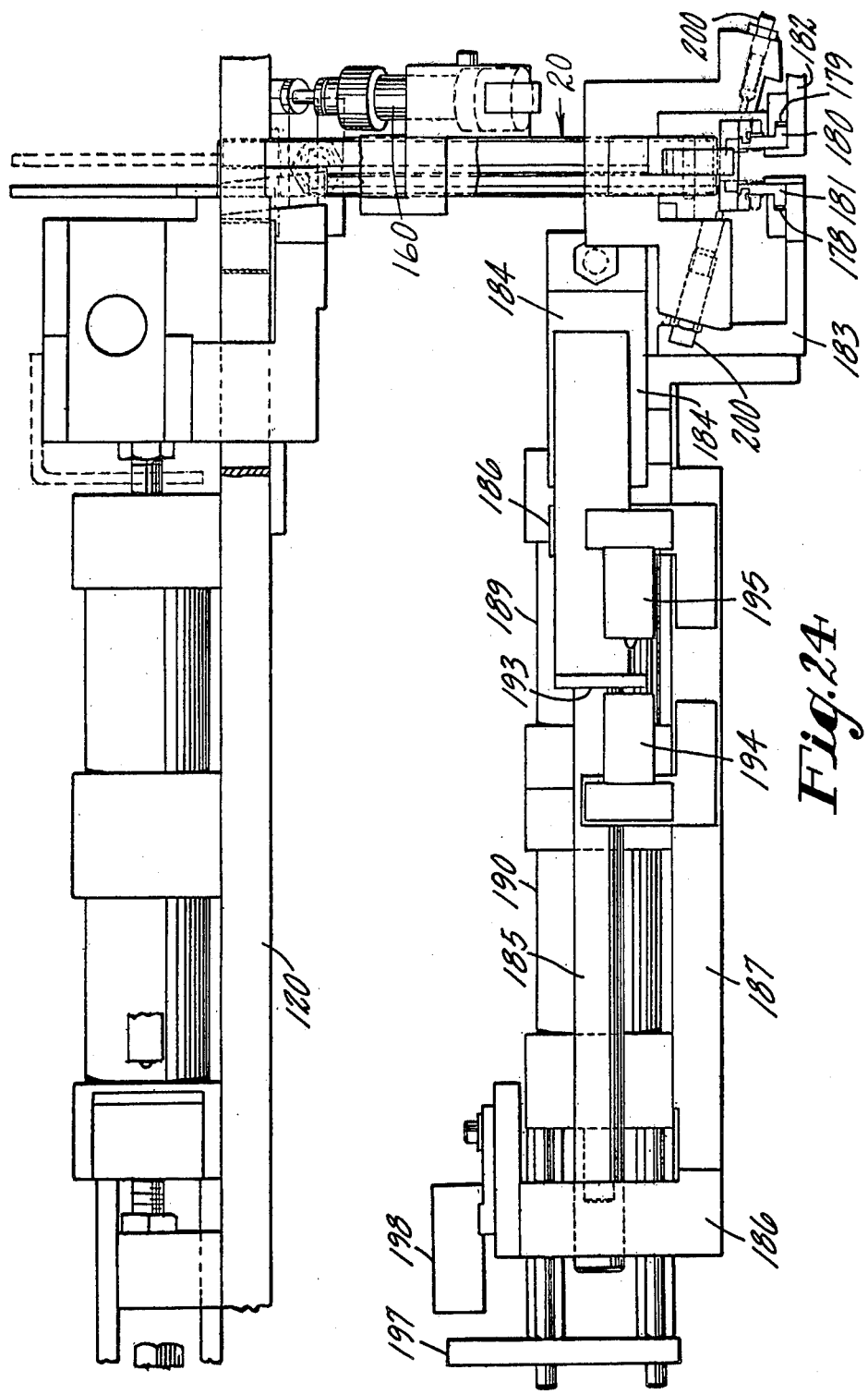
FIG. 24 is a view similar to FIG. 23 with the mandrel parts adjusted for large size components.
Figure 26:
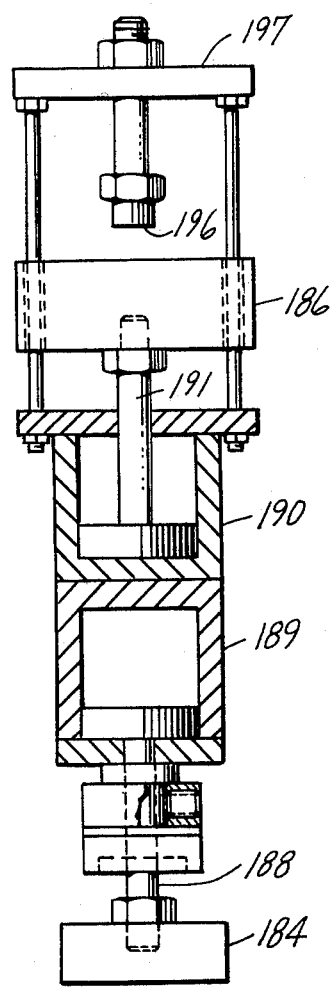
FIG. 26 is a schematic view of the cylinders which set the mandrel bars for size.

On signal from control unit 8 that a component having its leads conditioned in the unit 18 is ready to be dropped into the chute 20 by the retraction of gate 117 and provided that the previous component has been moved from the mandrel, pressure is introduced and/or exhausted selectively to and from the cylinders 189, 190 as follows: Referring to FIG. 26 when pressure is introduced to the rod end of cylinder 190 and the rod end of cylinder 189, the cylinders, bracket 184, and movable mandrel bar 181 are moved to the left as seen in FIG. 24 to accommodate the largest center space size (0.600") of the component. At this condition, a switch bar 193 extending from bracket 184 actuates a switch 194 to signal to the unit 8 the setting of the mandrel bars and to cause maintenance of the bars in such condition. By introduction of pressure to the head end of cylinder 189 and to the head end of cylinder 190 the piston rod 188, the bracket 184 and movable mandrel bar 181 are moved to the right as seen in FIG. 23 until the bar 193 actuates a switch 195 and the movable mandrel bar 181 is set in its narrowest size (0.300") condition. By then introducing pressure to the head end of cylinder 190 and also to the rod end of cylinder 189, the cylinders and bracket 184 are moved to the right as seen in FIG. 24 and the movable mandrel bar 181 is set in its intermediate size (0.400") condition. At this time a stop 196 (FIG. 25) mounted on a plate 197 fixed to the end of cylinder 190 engages an extension of bearing 186 and a part of the plate actuates a switch 198 also carried on the bearing extension. This stops the movable mandrel bar in its intermediate setting and signals the condition to the control unit 8.

As described above, the mandrel bar is set to the appropriate size setting, a component is fed down the chute 20 and along mandrel 22 and against the stop 26. A light source and detector cell 200 mounted on the inner chute member 164 detects passage of the component onto the mandrel and in line with the thruster 24 which comprises thruster bars 203 and 204 mounted on the mandrel bars 180, 181 respectively so as to partake of the size setting movements of the mandrel bars. The mandrel bars 180, 181 have extensions connected by a rod 206 fixed at opposite ends in a U-shaped bracket 208 which is connected to a piston rod 210 extending from a cylinder 212 fixed to the machine frame. The thruster bars 203, 204 are moved with the mandrel bars through springs as to yield to accommodate components of different lengths. When the fingers 28 and the cut-clinch unit 32 are ready to receive the component, pressure is introduced to the outboard end of cylinder 212 and the mandrel bars 180, 181 are moved to the left as seen in FIG. 25 along with the thrusters 203, 204 until the leading end of the component engages the stop 25 (FIG. 2) and are located between the pair of fingers 28.

COMPONENT LOCATING STOPS

The stop 25 (FIGS. 27-29) includes two stop members 214 having fingers at one end adapted to engage the end leads L of the component C and locate the leads for engagement by the fingers 28. One stop member 214 is slidable on a rod 213 (FIG. 29) mounted in the lower end of a composite bracket 215 fixed to the plate 120. The other stop member is mounted in similar fashion in the lower end of a bracket 216 which is mounted for sliding movement on a shaft 217 rotatable in but fixed against axial movement in the bracket 215. Bracket 216 also is slidable on a pin 218 extending from the lower end of bracket 215. The one stop member is connected by a pin and slot connection to the lower end of an arm 220 fixed on the shaft 217. The other stop is also connected by a similar pin and slot connection to the lower end of an arm 222 fixed on a sleeve 223 in the bracket 216 slidable along but keyed for rotation with the shaft 217 The right end of shaft 217, as seen in FIGS. 27 and 28, has fixed thereto an arm 224 connected to a piston rod 225 extending down from a cylinder 226 fixed to the composite bracket 215. When pressure is applied to the lower end of cylinder 226 the arm 224 is swung up and the stop members 214 are moved into lead engaging positions as determined by adjustable stops 227 on the end of rods extending from the stop members 214 through the front of brackets 215, 216. To prevent distortion of the end component leads by engagement with the stop members 214 caused by movement of the thruster bars, the end of the component body engages energy absorbing plungers 228 before the end leads engage the stop members. The plungers 228 are slidable in the stop members and are each provided with an upramp portion 229 which act against spring pressed bars 230 to absorb most of the kinetic energy imparted to the component by the thruster bars. Thus, the component is slowed by the plungers 228 before the end leads engage the stop members 214 for registering the rows of the leads with notches in the fingers 28. A down ramp portion on each plunger acts to retract each plunger at this time.

Before the component is moved by the thruster bars, the stop members 214 are set to accommodate the lead center spacing of the component on the mandrel 22. To this end, the bracket 216 is connected to a bracket 231 (FIG. 27) through a plate 232 and a slide 234 having a roll 235 in a guide 236 in the bracket 231. The bracket 231 is slidable on a rod 237 fixed in lugs depending from plate 120 and is further guided by a roll 238 running in a guide on the underside of plate 120. The bracket 231 is fixed to a piston rod 240 extending from a cylinder 242 which is fixed end to end to a cylinder 244 (FIG. 28) having a piston rod connected to a lug depending from plate 120 and in which the rod 237 also is fixed. The operation of cylinders 242, 244 and the size setting of the movable bracket 216 and stop members 214 is controlled by unit 8 in a generally similar manner as that described above in relation to the cylinders 189, 190 and the size setting of the movable mandrel bar 181. Thus, the stop members are adjusted for size and act to locate the leads of each component for accurate registration with the notches in the fingers 28.

FINGER MECHANISM

The finger unit 28 includes a pair of fingers 246 and 248 (FIG. 3) provided with notches adapted to engage the component leads in the same general manner as described in U.S. Pat. No. 3,550,238 which is incorporated herein by reference and to which reference may be had for a more complete explanation of the details of construction and purpose of the fingers. The finger 246 is pivoted on a bracket 250 mounted for heightwise reciprocation on guides 251 depending from plate 120. The finger 248 is pivoted on the slide 234 so as to be settable along with the stop members 214 as described above. As noted above, the cylinders 242, 244 are operated under the control of unit 8 so as to set the fingers (along with the stop members) to engage the leads of the component transferred by the thruster 24 according to the center space size of the component. The notches of the fingers engage the component leads to ensure proper spacing between adjacent leads. The two rows of leads extending down from opposite sides of the component were first conditioned in the lead forming unit 18 so as to be bent slightly outward from the precise center spacing desired. The two rows of leads straddle the mandrel bars which are also set to the desired center spacing and as the fingers 246, 248 close on the leads they are moved inwardly to the precise center spacing of the aperture in the circuit board by the interaction of the mandrel bars and the fingers. The mandrel 22 and stop 25 are then retracted by reversal of cylinders 226 and 212 respectively. The bracket 250 (see also FIG. 27) is moved downward on the guides 251 by a cylinder 254 (FIG. 3) until the leads of the component enter the matching holes in the circuit board B. The cut-clinch unit 32 which underlies the board B and is set also to match the center spacing of the leads of the component being inserted in the same general manner and under the control of unit 8. The cut-clinch unit may be similar to that used in the machine shown in U.S. Pat. No. 4,063,347 and its specific operation is not important to an understanding of the present invention. After the leads have entered the holes in the board, the pusher 30 mounted on guides 256 (FIG. 3) in the bracket 250 moves the body of the component down for seating on the board by pressure applied to a second part of cylinder 258 and the fingers 246, 248 are opened to release the component. The pusher 30 includes a pair of bars 260 each having spring pressed fingers 261 as seen in FIG. 3 to ensure that the component body is initially aligned with the energy absorbing plungers 228 as it is moved along the mandrel by the thruster. The left pusher bar 260 (as seen in FIG. 3) is mounted within the opening between plate 232 and slide 234 (FIG. 27) and adjacent to finger 248 so as to be set along with the fingers 28 and stops 25 to accommodate the component lead center spacing by cylinders 242, 244. The cut-clinch unit cuts any excess lead lengths and clinches the leads against the underside of the board which may be located to receive the component in the desired location such as by an X-Y cross slide mechanism 6 also under the control of unit 8.

GENERAL SEQUENCE

As soon as the mandrel bars are retracted they are free to be set to accommodate the next component in the lead conditioning unit 18 and the gate 117 may be retracted to drop the next component down the chute 20 onto the mandrel. As soon as the component is dropped from the conditioning unit 18, the gate 117 is returned and the lead formers are set to the center spacing size of the next component then in the shuttle 72 which moves from the overlying picker 13 or 15 and the gate 90 is retracted to drop the next component into the unit 18. The shuttle 72 returns to its central position where the next selected component in one of the pickers is dropped into the shuttle container, the gate 90 having returned to its initial position to support the component in the shuttle. As soon as the component is dropped into the shuttle, the picker from which it was dropped is free to be moved to select another component from the selected magazine channel. As described above, the pickers 12 and 14 are free to pass each other on the way to a selected magazine, the only restraints being that only one picker receptacle can be registered with the shuttle in central position and only one picker at a time can select a component from any magazine channel. Through signals from the various detector cells signalling passage of the components into and out of the various units and signals from the various limit switches which indicate setting of the various units for size as well as location of the unit mechanisms, the control unit 8 which may include suitable computer means which may be selected from a wide variety of available computers keep track of the condition and location of the units and the selected components. The control unit 8 may be programmed such as by tape readers, which also may be selected from a wide variety of those available, to select components of a variety of sizes and purposes from magazines and to condition and insert the selected components in the selected location on a circuit board on an X-Y table.

It should be apparent from the above description that a variety of mechanisms, detecting and signalling devices and controls could be substituted for those described or referred to without departing from the scope of the invention defined by the following claims:

We claim:

1. In a machine for applying to circuit boards a succession of components selected individually from magazines and having picker means movable in a predetermined sequence between selected magazines and a component conditioning means, the improvement in which each of the magazines is adapted to contain similarly configured components of a center line spacing different from the center line spacing of the components in each of the other magazines and each magazine is provided with control means indicating the configuration of the components in the magazine, said conditioning means being settable to operate on each component delivered by the picker means according to the control means on the magazine from which the component is selected.

2. A machine according to claim 1 in which the control means comprises switches fixed on a frame to which each magazine is detachably mounted and actuators on each magazine for closing the switches in a pattern peculiar to the configuration of the components in the magazine.

3. A machine according to claim 1 in which the conditioning means is settable to operate on each of a variety of component configurations depending on the configuration of the selected component delivered to the conditioning means.

4. A machine according to claim 1 in which the components to be conditioned have leads with a variety of center spacings and the conditioning means are settable to operate on the leads of each of said variety according to the center spacing of the component selected from a magazine and delivered to the conditioning means.

5. A machine according to claim 4 in which the conditioning means comprises inside formers adapted to be received between spaced rows of said leads and outside formers located outside said leads and arranged to be moved toward the inside formers to press the leads thereagainst, one set of an inside former and outside former being movable bodily relative to the other set of formers to receive and operate on the leads of the selected component being delivered depending on the center spacing of the selected component.

6. A machine according to claim 1 in which the machine also includes means for inserting the leads on each component into apertures of printed circuit boards, the inserting means being settable independently of the conditioning means to engage the leads of each component delivered thereto according to the center spacing of the delivered component.

7. A machine according to claim 6 in which a succession of components are selected, conditioned and inserted in independent overlapping sequence and the conditioning means and the inserting means are independently settable according to the configuration of the component about to be received thereby.

8. a machine according to claim 7 in which sensing means are provided to detect selection of each component, the delivery of the component to the conditioning means and delivery of the conditioned component to the inserting means for controlling the setting and sequential operation of the picker means, conditioning means and the inserting means.

9. A machine according to claim 8 in which the sensing means provide signals to control the operation of the machine to select, condition and insert a series of components in independent overlapping sequence.

10. A machine for applying to circuit boards a succession of components selected individually from magazines and having picker means movable in a predetermined sequence between selected magazines and a component conditioning means, the improvement in which the magazines contain a variety of differently configured components, each of the magazines is adapted to have components with a center line spacing different from the center line spacing of the components in each of the other magazines, each magazine having control means peculiar to the configurations of the components' in the magazine, said conditioning means being settable to operate on each component as it is being delivered by the picker means according to the control means on the magazine from which the component is selected.

11. A machine according to claim 10 in which the variety of component configuration comprises a variety of center spacings of the leads of the components and the conditioning means is settable according to each of the variety center spacings.

12. A machine according to claim 11 in which the machine is also provided with means for inserting the component leads in apertures of a circuit board.

13. A machine according to claim 12 in which the inserting means is also settable according to the center spacing of the component being delivered thereto.

14. A machine according to claim 11 in which sensing means are provided to detect selection of each component by the picker means from the magazines and delivery of each component to the conditioning means and for providing signals to control the setting of the conditioning means to operate on the component according to its configuration as determined by the control means of the magazine from which the component was selected.

15. A machine according to claim 14 in which the machine is also provided with means for applying the components to a circuit board and the sensing means also detects delivery of a conditioned component to the applying means.

16. A machine according to claim 15 in which the sensing means provide signals to control the operation of the machine so that a series of components are selected by the picker means and conditioned by the conditioning means and applied to the circuit board in independent, overlapping sequence.

* * * * *